United States Patent
Kim

(10) Patent No.: US 8,692,601 B2
(45) Date of Patent: Apr. 8, 2014

(54) SIGNAL DELAY CIRCUIT

(75) Inventor: Jung Hyun Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/339,206

(22) Filed: Dec. 28, 2011

(65) Prior Publication Data

US 2013/0106482 A1    May 2, 2013

(30) Foreign Application Priority Data

Oct. 26, 2011    (KR) .................. 10-2011-0110003

(51) Int. Cl.
*H03H 11/26*    (2006.01)
(52) U.S. Cl.
USPC .......................................... 327/276
(58) Field of Classification Search
USPC .................................. 327/276, 277
See application file for complete search history.

(56) References Cited

U.S. PATENT DOCUMENTS

| | | | | |
|---|---|---|---|---|
| 5,077,538 A | * | 12/1991 | Gehrt et al. ................... | 329/319 |
| 5,963,071 A | * | 10/1999 | Dowlatabadi ................. | 327/175 |
| 6,229,364 B1 | * | 5/2001 | Dortu et al. ................... | 327/158 |
| 6,727,733 B2 | * | 4/2004 | Klein ............................. | 327/108 |
| 7,518,434 B1 | * | 4/2009 | Jurasek et al. ................ | 327/538 |
| 7,522,460 B2 | * | 4/2009 | Lee ................................ | 365/194 |
| 7,558,336 B2 | * | 7/2009 | Osaka et al. .................. | 375/316 |
| 7,683,683 B1 | * | 3/2010 | Majumder et al. ............ | 327/122 |
| 8,400,189 B2 | * | 3/2013 | Moon ............................. | 327/77 |
| 2012/0105107 A1 | * | 5/2012 | Moon ............................. | 327/40 |

* cited by examiner

*Primary Examiner* — William Hernandez
(74) *Attorney, Agent, or Firm* — William Park & Associates Patent Ltd.

(57) ABSTRACT

A signal delay circuit includes a voltage detection unit and a signal delay unit. The voltage detection unit is configured to detect an external voltage level based on a reference voltage and generate a detection signal. The signal delay unit is configured to control a delay amount of an input signal in response to the detection signal.

15 Claims, 6 Drawing Sheets

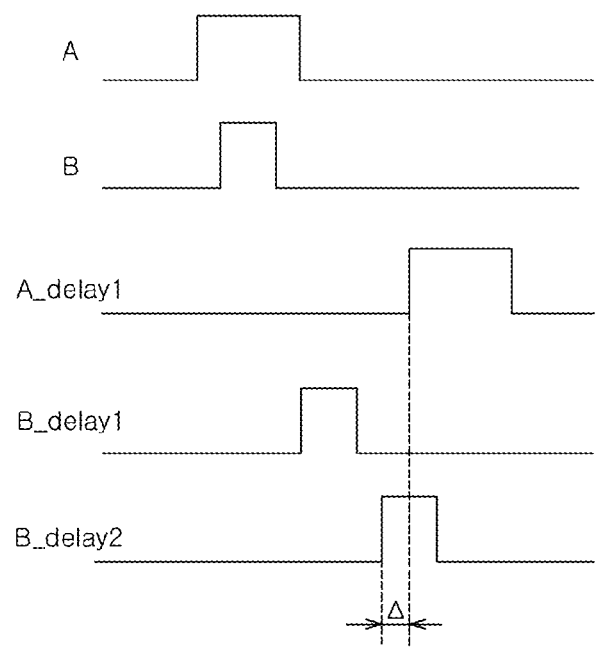

SIGNAL DELAY CIRCUIT

CROSS-REFERENCES TO RELATED APPLICATION

The present application claims priority under 35 U.S.C. §119(a) to Korean application number 10-2011-0110003, filed on Oct. 26, 2011, in the Korean Intellectual Property Office, which is incorporated herein by reference in its entirety as set forth in full.

BACKGROUND

1. Technical Field

The present invention relates to a semiconductor integrated circuit, and more particularly, to a signal delay circuit.

2. Related Art

FIG. 1 is a block diagram of a conventional semiconductor integrated circuit, illustrating an example of signal transmission which is performed in a semiconductor integrated circuit.

Referring to FIG. 1, signals A and B are combined and processed by a signal combination unit 4. However, since the signals are transmitted through separate signal transmission paths, that is, signal A is transmitted through a signal transmission path 1 and the signal B is transmitted through a signal transmission path 2, the two signals may have different delay amounts. Therefore, the semiconductor integrated circuit may additionally include a signal delay circuit 3 such that the two signals meet each other within a sufficient timing margin. The signal delay circuit 3 controls a time margin between the two signals by adding a delay amount of the signal B which would otherwise arrive before signal A. Therefore, it is very important to constantly delay the signal B by the delay amount set by the signal delay circuit 3.

However, an external voltage VDD to drive the signal delay circuit 3 may be varied by various factors, and thus the delay amount may also be varied.

FIGS. 2A to 2C are waveform diagrams explaining the signal transmission of FIG. 1.

FIG. 2A is a waveform diagram when the external voltage VDD is at a normal level. The signals A and B are outputted as signals A_delay1 and B_delay1 through the signal transmission paths 1 and 2, respectively. In order to control the timing margin between the two signals, the signal B is additionally delayed into a signal B_delay2 through the signal delay circuit 3. Therefore, the signals A and B meet each other with a sufficient timing margin in the signal combination unit 4.

FIG. 2B is a waveform diagram when the external voltage VDD is at a low level. When the external voltage VDD for driving the signal delay circuit 3 is at a low level, the signal delay circuit 3 delays the signal B_delay1 by a longer time than the set delay amount, and outputs the delayed signal as the signal B_delay2, where signal B_delay2 is delayed longer than a proper amount and thus signal B_delay2 does not meet signal B_delay1 within a sufficient time margin in the signal combination unit 4.

FIG. 2C is a waveform diagram when the external voltage VDD is at a high level. When the external voltage VDD for driving the signal delay circuit 3 is at a high level, the signal delay circuit 3 delays the signal B_delay1 by a shorter time than the set delay amount, and outputs the delayed signal as the signal B_delay2, where signal B_delay2 is delayed shorter than a proper amount and thus B_delay2 does not meet signal B_delay1 within a sufficient time margin in the signal combination unit 4.

In the case of FIGS. 2B and 2C, the signals A and B meet each other with an insufficient margin. Therefore, a malfunction may occur in the entire semiconductor integrated circuit.

SUMMARY

A signal delay circuit capable of constantly maintaining a delay time without being affected by an external voltage level is described herein.

In one embodiment of the present invention, a signal delay circuit includes: a voltage detection unit configured to detect an external voltage level based on a reference voltage and generate a detection signal; and a signal delay unit configured to control a delay amount of an input signal in response to the detection signal.

In another embodiment of the present invention, a signal delay circuit includes: a voltage detection unit configured to detect an external voltage level as a plurality of voltage levels, based on a reference voltage, and generate a multi-bit detection signal; a decoder configured to decode values of the multi-bit detection signal into a selection signal; and a signal delay unit configured to delay a delay amount of an input signal in response to the selection signal.

Still another embodiment is directed to a method of delaying a signal via a signal delay circuit, comprising: receiving a reference voltage, an external voltage and an input signal at the signal delay circuit; and delaying the input signal based on a relationship between the reference voltage and the external voltage.

BRIEF DESCRIPTION OF THE DRAWINGS

Features, aspects, and embodiments are described in conjunction with the attached drawings, in which:

FIGS. 2A to 2C are waveform diagrams explaining a signal transmission of FIG. 1;

DETAILED DESCRIPTION

Hereinafter, a signal delay circuit according to embodiments of the present invention will be described below with reference to the accompanying drawings through example embodiments.

Figure 1:
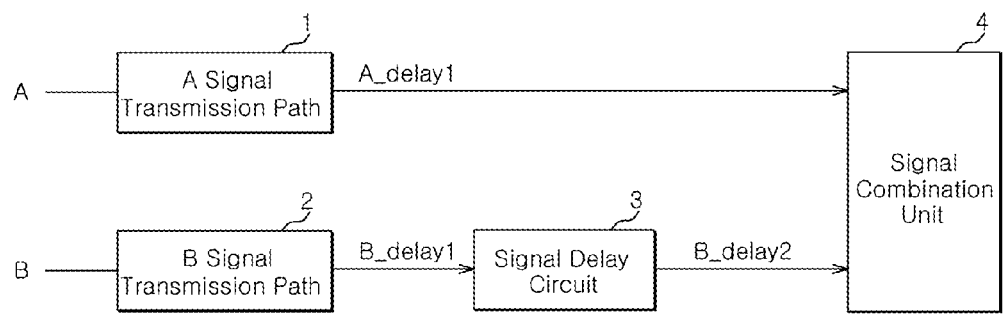
FIG. 1 is a block diagram of a conventional semiconductor integrated circuit, illustrating an example of signal transmission which is performed in the semiconductor integrated circuit.
Figure 2A:
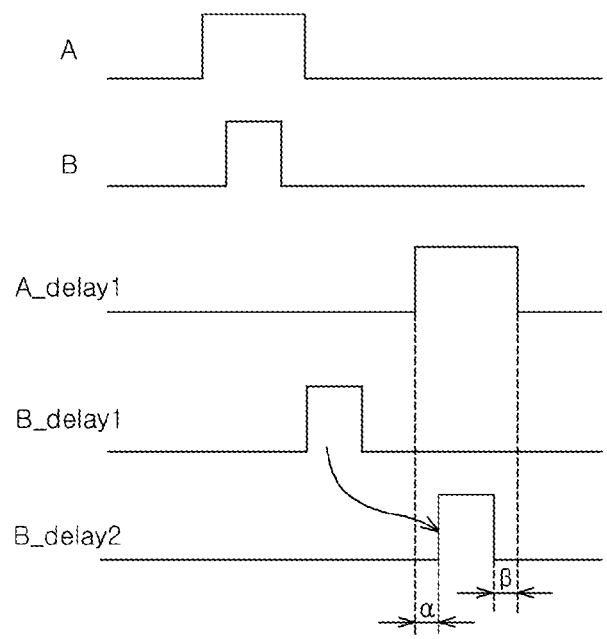
Figure 2B:
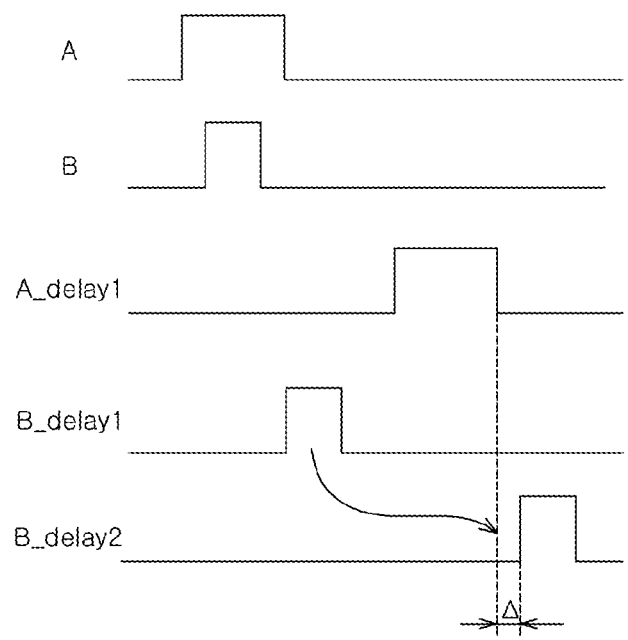
Figure 3:
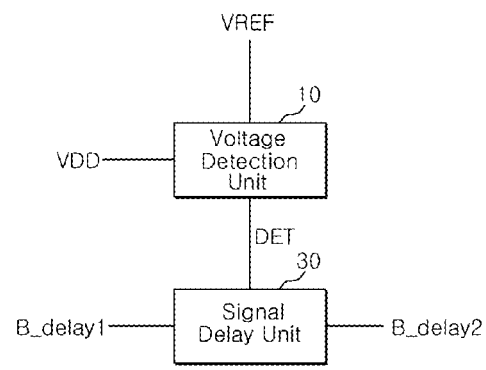
FIG. 3 is a block diagram of a signal delay circuit according to one embodiment.

FIG. 3 is a block diagram of a signal delay circuit according to one embodiment.

The signal delay circuit of FIG. 3 includes a voltage detection unit 10 and a signal delay unit 30.

The voltage detection unit 10 is configured to detect a level of an external voltage VDD based on a reference voltage VREF and generate a detection signal DET.

The signal delay unit 30 is configured to control a delay amount of an input signal B_delay1 in response to the detection signal DET, and output the controlled signal as an output signal B_delay2.

That is, when the voltage detection unit 10 determines whether the level of the external voltage VDD is a high or low level based on the reference voltage VREF and outputs the detection signal DET, the signal delay unit 30 may increase or reduce a delay amount of a signal to be transmitted according to the level of the corresponding external voltage VDD.

The voltage detection unit 10 may include a comparator (not illustrated). The voltage detection unit 10 detects when the level of the external voltage VDD is a low level, based on the reference voltage VREF. For example, when the level of the external voltage VDD is lower than the reference voltage VREF, the comparator may output a high-level detection signal DET, and when the level of the external voltage VDD is higher than the reference voltage VREF, the comparator may output a low-level detection signal DET.

Figure 4:
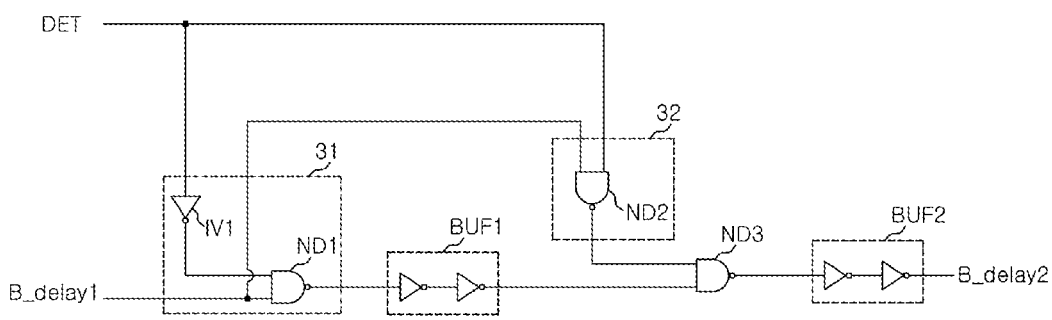
FIG. 4 is a circuit diagram illustrating a configuration of a signal delay unit of FIG. 3.

FIG. 4 is a circuit diagram illustrating a specific configuration of the signal delay unit 30.

The signal delay unit 30 includes a first delay selector 31, a second delay selector 32, a first buffer BUF1, a third NAND gate ND3, and a second buffer BUF2.

The first delay selector 31 includes a first inverter IV1 and a first NAND gate ND1. The first inverter IV1 is configured to invert the detection signal DET. The first NAND gate ND1 is configured to perform a NAND operation on the inverted detection signal DET and the input signal B_delay1. That is, when the detection signal DET is at a low level, the first NAND gate ND1 serves as an inverter to invert the input signal B_delay1.

The second delay selector 32 includes a second NAND gate ND2. The second NAND gate ND2 is configured to perform a NAND operation on the detection signal DET and the input signal B_delay1. That is, when the detection signal DET is at a high level, the second NAND gate ND2 serves as an inverter to invert the input signal B_delay1.

The first buffer BUF1 is configured to delay an output of the first delay selector 31.

The delay amount of the first buffer BUF1 may be set in consideration of a delay time difference of the signal delay unit 30 according to the level of the external voltage VDD.

The third NAND gate ND3 is configured to perform a NAND operation on an output of the second delay selector 32 and an output of the first buffer BUF1. That is, when the output of the second delay selector 32 is at a high level, the third NAND gate ND3 operates as an inverter to invert the output of the first buffer BUF1, and when the output of the first buffer BUF1 is at a high level, the third NAND gate ND3 operates as an inverter to invert the output of the second delay selector 32. That is, a delay path selected by the first delay selector 31 or a delay path selected by the second delay selector 32 is determined as the delay path.

The second buffer BUF2 is configured to delay an output of the third NAND gate ND3.

The delay amount of the second buffer BUF2 may be set in consideration of a timing margin with a signal which is to be subsequently combined.

A specific operation of the signal delay unit 30 will be described as follows.

For example, when the level of the external voltage VDD is lower than the reference voltage VREF, a high-level detection signal DET may be inputted to the signal delay unit 30.

When the signal delay unit 30 receives a high-level detection signal, the first delay selector 31 always outputs a high-level signal regardless of the input signal B_delay1, and thus the first buffer BUF1 always outputs a high-level signal.

On the other hand, the second delay selector 32 serves as an inverter to invert the input signal B_delay1. The third NAND gate ND3 also serves as an inverter to invert an output of the second delay selector 32.

Therefore, when the high-level detection signal DET is inputted to the signal delay unit 30, the delay amount is set in such a manner that the input signal B_delay1 passes through the second delay selector 32, the third NAND gate ND3, and the second buffer BUF2.

When, however, the level of the external voltage VDD is higher than the reference voltage VREF, a low-level detection signal DET may be inputted to the signal delay unit 30.

When the signal delay unit 30 receives a low-level detection signal DET, the first delay selector 31 serves as an inverter to invert the input signal B_delay1. On the other hand, because the detection signal DET is at a low-level, the second delay selector 32 always outputs a high-level signal regardless of the input signal B_delay1. Therefore, the third NAND gate ND3 serves as an inverter to invert an output of the first buffer BUF1.

Therefore, when the low-level detection signal DET is inputted, the delay amount is set in such a manner that the input signal B_delay1 passes through the first delay selector 31, the first buffer BUF1, the third NAND gate ND3, and the second buffer BUF2.

That is, when the external voltage VDD is at a low level, the delay amount is set to be smaller than when the external voltage VDD is at a high level. Accordingly, the input signal B_delay1 may be outputted with a sufficient timing margin.

Figure 5:
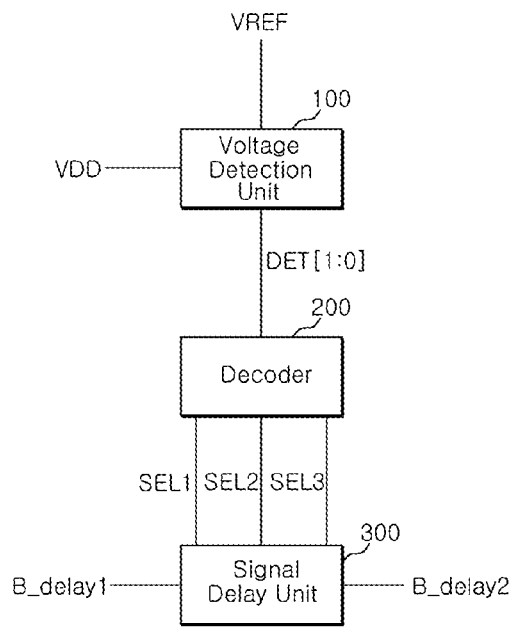
FIG. 5 is a block diagram illustrating a signal delay circuit according to another embodiment.

FIG. 5 is a block diagram illustrating a signal delay circuit according to another embodiment.

The signal delay circuit of FIG. 5 includes a voltage detection unit 100, a decoder 200, and a signal delay unit 300.

The voltage detection unit 100 is configured to detect the level of an external voltage VDD as a plurality of voltage levels, based on a reference voltage VREF, and generate a multi-bit detection signal DET[1:0].

The decoder 200 is configured to decode the respective values of the detection signal DET[1:0] into selection signals SEL1 to SEL3.

The signal delay unit 300 is configured to control the delay amount of an input signal B_delay1 in response to the selection signals SEL1 to SEL3, and output an output signal B_delay2.

That is, when the voltage detection unit 100 detects the level of the external voltage VDD as the plurality of levels and outputs the multi-bit detection signal DET[1:0], the signal delay unit 300 may more precisely increase or reduce the delay amount according to the level of the external voltage VDD.

Figure 6:
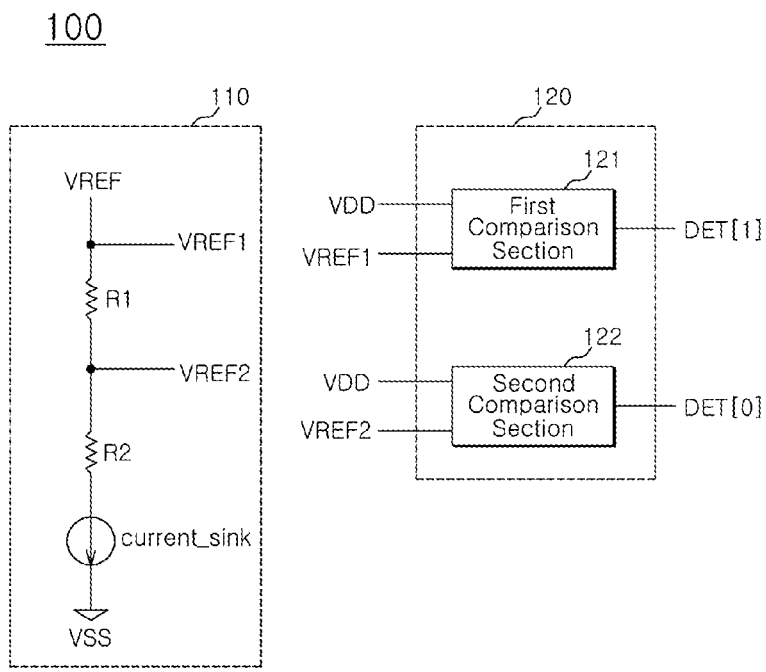
FIG. 6 is a circuit diagram illustrating a configuration of a voltage detection unit of FIG. 5.

FIG. 6 is a circuit diagram illustrating a specific configuration of the voltage detection unit 100.

The voltage detection unit 100 includes a reference voltage divider 110 and a comparator 120.

In this embodiment, the signal delay circuit is designed in such a manner that a level of the external voltage VDD is detected as three levels. However, in other embodiments the level may be divided into a larger number of voltage levels.

The reference voltage divider 110 is configured to divide the external voltage through a current sink current_sink and a plurality of resistors R1 and R2 and generate first and second divided reference voltages VREF1 and VREF2. The first and second divided reference voltages VREF1 and VREF2 are used for discriminating the level of the external voltage VDD.

The comparator 120 is configured to compare the external voltage VDD with the first and second divided reference voltages VREF1 and VREF2, and output the comparison results as the respective bits of the multi-bit detection signal DET[1:0].

For example, the external voltage VDD may be compared with the first divided reference voltage VREF1. In this case, when the level of the external voltage VDD is lower than the first divided reference voltage VREF1, the comparator 120 outputs a signal DET[1] having a value of 1, and when the level of the external voltage VDD is higher than the first divided reference voltage VREF1, the comparator 120 outputs a signal DET[1] having a value of 0.

Furthermore, the external voltage VDD may be compared with the second divided reference voltage VREF2. In this case, when the level of the external voltage VDD is lower than the second divided reference voltage VREF2, the comparator 120 outputs a signal DET[0] having a value of 1, and when the level of the external voltage VDD is higher than the second divided reference voltage VREF2, the comparator 120 outputs a signal DET[1] having a value of 0.

That is, when the level of the external voltage VDD is higher than the first divided reference voltage VREF1, a detection signal DET[1:0] having a value of [00] is outputted. When the level of the external voltage VDD is higher than the second divided reference voltage VREF2 and lower than the first divided reference voltage VREF1, a detection signal DET[1:0] having a value of [10] is outputted. When the level of the external voltage VDD is lower than the second divided reference voltage VREF2, a detection signal DET[1:0] having a value of [11] is outputted.

The decoder 200 is configured to select selection signals SEL1 to SEL3 corresponding to the respective values of the multi-bit detection signal DET[1:0]. For example, the decoder 200 selects the first selection signal SEL1 when the detection signal DET[1:0] is [00], selects the second selection signal SEL2 when the detection signal DET[1:0] is [10], and selects the third selection signal SEL3 when the detection signal DET[1:0] is [11]. The decoder 200 may include an existing decoder.

Figure 7:
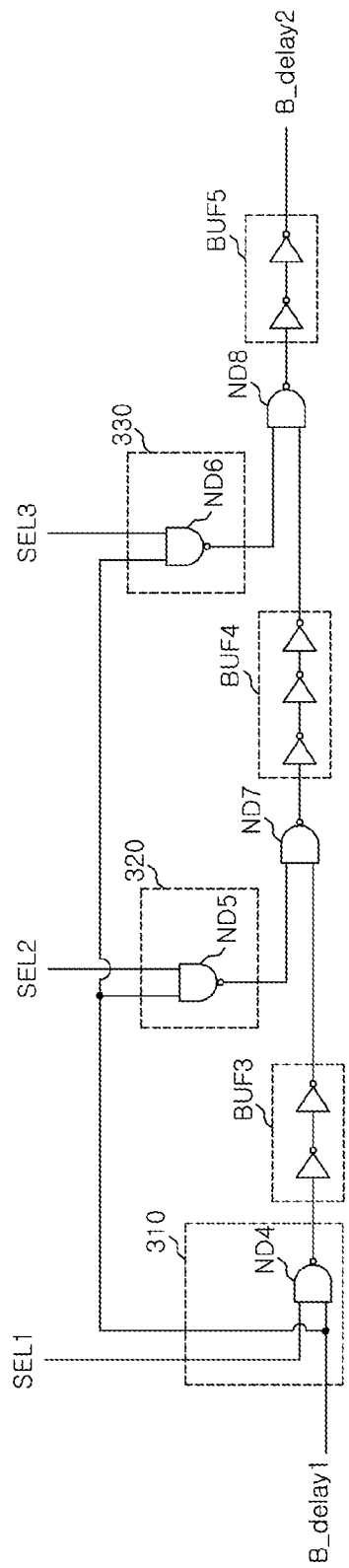
FIG. 7 is a circuit diagram illustrating a configuration of a signal delay unit of FIG. 5.

FIG. 7 is a circuit diagram illustrating a specific configuration of the signal delay unit 300.

The signal delay unit 300 includes a first delay selector 310, a second delay selector 320, a third delay selector 330, a first buffer BUF3, a third NAND gate ND7, a second buffer BUF4, a fourth NAND gate ND8, and a third buffer BUF5.

The first delay selector 310 includes a first NAND gate ND4. The first NAND gate ND4 is configured to perform a NAND operation on the first selection signal SEL1 and an input signal B_delay1. That is, when the first selection signal SEL1 is selected at a high level, the first NAND gate ND4 operates as an inverter to invert the input signal B_delay1.

The second delay selector 320 includes a second NAND gate ND5. The second NAND gate ND5 is configured to perform a NAND operation on the second selection signal SEL2 and the input signal B_delay1. That is, when the second selection signal SEL2 is selected at a high level, the second NAND gate ND2 operates as an inverter to invert the input signal B_delay1.

The third delay selector 330 includes a third NAND gate ND6. The third NAND gate ND6 is configured to perform a NAND operation on the third selection signal SEL3 and the input signal B_delay1. That is, when the third selection signal SEL3 is selected at a high level, the third NAND gate ND6 operates as an inverter to invert the input signal B_delay1.

The first buffer BUF3 is configured to delay an output of the first delay selector 310. The delay amount of the first buffer BUF3 may be set in consideration of a delay time difference of the signal delay unit 300 based on the level of the external voltage VDD.

The third NAND gate ND7 is configured to perform a NAND operation on an output of the second delay selector 320 and an output of the first buffer BUF3. That is, when the output of the second delay selector 320 is at a high level, the third NAND gate ND7 operates as an inverter to invert the output of the first buffer BUF3, and when the output of the first buffer BUF3 is at a high level, the third NAND gate ND7 operates as an inverter to invert the output of the second delay selector 320. That is, a delay path selected by the first delay selector 310 or a delay path selected by the second delay selector 320 is determined as the delay path.

The second buffer BUF4 is configured to delay an output of the third NAND gate ND7. In this embodiment, the second buffer BUF4 is configured as a delay unit for inverting an input signal. The delay amount of the second buffer BUF4 may be set in consideration of a delay time difference of the signal delay unit 300 based on the level of the external voltage VDD.

The fourth NAND gate ND8 is configured to perform a NAND operation on an output of the third delay selector 330 and an output of the second buffer BUF4. That is, when the output of the third delay selector 330 is at a high level, the fourth NAND gate ND8 operates as an inverter to invert the output of the second buffer BUF4, and when the output of the second buffer BUF4 is at a high level, the fourth NAND gate ND8 operates as an inverter to the output of the third delay selector 330. That is, a delay path selected by the first or second delay selector 310 or 320 or a delay path selected by the third delay selector 330 is determined as the delay path.

The third buffer BUF5 is configured to delay an output of the fourth NAND gate ND8. The delay amount of the third buffer BUF5 may be set in consideration of a timing margin with a signal which is to be subsequently combined.

The specific operation of the signal delay unit 300 will be described as follows.

For example, when the external voltage VDD corresponds to the highest level among the voltage levels divided from the reference voltage VREF, the detection signal DET[1:0] having a value of [00] may be generated and the first selection signal SEL1 may be selected.

In this case, the first delay selector 310 serves as an inverter to invert the input signal B_delay1. On the other hand, the second and third delay selectors 320 and 330 always output a high-level signal regardless of the input signal B_delay1. Therefore, the third NAND gate ND7 serves as an inverter to invert the output of the first buffer BUF3, and the fourth NAND gate ND8 serves as an inverter to invert the output of the second buffer BUF4.

Therefore, when the first selection signal SEL1 is selected, the delay amount is set in such a manner that the input signal B_delay1 passes through the first delay selector 310, the first buffer BUF3, the third NAND gate ND7, the second buffer BUF4, the fourth NAND gate ND8, and the third buffer BUF5. The input signal B_delay1 is delayed by the delay amount, inverted, and outputted as the output signal B_delay2.

On the other hand, when the external voltage VDD corresponds to the intermediate level among the voltage levels divided from the reference voltage VREF, the detection signal DET[1:0] having a value of [10] may be generated, and the second selection signal SEL2 may be selected.

In this case, the first delay selector 310 always outputs a high-level signal regardless of the input signal B_delay1, and thus the first buffer BUF3 also outputs a high-level level at all times.

On the other hand, the second delay selector 320 serves as an inverter to invert the input signal B_delay1. The third NAND gate ND7 also serves as an inverter to invert the output of the second delay selector 320.

Furthermore, since the third delay selector 330 always outputs a high-level signal regardless of the input signal B_delay1, the fourth NAND gate ND8 also serves as an inverter to invert the output of the second buffer BUF4.

Therefore, when the second selection signal SEL2 is inputted, the delay amount is set in such a manner that the input signal B_delay1 passes through the second delay selector 320, the third NAND gate ND7, the second buffer BUF4, the fourth NAND gate ND8, and the third buffer BUF5. The input signal B_delay1 is delayed by the delay amount, inverted, and outputted as the output signal B_delay2.

Finally, when the external voltage VDD corresponds to the lowest level among the voltage levels divided from the reference voltage VREF, the detection signal DET[1:0] having a value of [11] may be generated, and the third selection signal SEL3 may be selected.

In this case, the first delay selector 310 always outputs a high-level signal regardless of the input signal B_delay1, and thus the first buffer BUF4 also outputs a high-level signal at all times.

Furthermore, the second delay selector 320 always outputs a high-level signal regardless of the input signal B_delay1. Therefore, the third NAND gate ND7 always outputs a low-level signal, and the second buffer BUF4 always outputs a high-level signal.

On the other hand, the third delay selector 330 serves as an inverter to invert the input signal B_delay1, and the fourth NAND gate ND8 also serves as an inverter to invert the output of the third delay selector 330.

Therefore, when the third selection signal SEL3 is inputted, the delay amount is set in such a manner that the input signal B_delay1 passes through the third delay selector 330, the fourth NAND gate ND8, and the third buffer BUF5. The input signal B_delay1 is delayed by the delay amount, and outputted as the output signal B_delay2.

In this embodiment, when the external voltage VDD is at a low level, the delay amount is set to a small value, and when the external voltage VDD is at a high level, the delay amount is set to a large value. Therefore, the input signal B_delay1 may be always outputted with the same timing margin.

According to the embodiments, although the external voltage level varies, the input signal may be delayed by the set time.

While certain embodiments have been described above, it will be understood to those skilled in the art that the embodiments described are by way of example only. Accordingly, the signal delay circuit described herein should not be limited based on the described embodiments. Rather, the signal delay circuit described herein should only be limited in light of the claims that follow when taken in conjunction with the above description and accompanying drawings.

What is claimed is:

1. A signal delay circuit comprising:
   a voltage detection unit configured to generate a detection signal in response to a result of comparing an external voltage level with a reference voltage, wherein the detection signal is determined by a variation of the external voltage level; and
   a signal delay unit configured to control a delay amount of an input signal in response to the detection signal and to include a first delay selector configured to be enabled to select a delay amount having a first delay time in response to the level of the detection signal and a second delay selector configured to be enabled to select a delay amount having a second delay time in response to the level of the detection signal,
   wherein the first delay time is set to be larger than the second delay time,
   wherein when the detection signal is at a low level, the first delay selector is enabled, and when the detection signal is at a high level, the second delay selector is enabled,
   wherein the voltage detection unit generates a high-level detection signal when the external voltage level is lower than the reference voltage.

2. The signal delay circuit according to claim 1, wherein the first delay selector comprises a first NAND gate configured to receive an inverted detection signal and the input signal.

3. The signal delay circuit according to claim 1, wherein the second delay selector comprises a second NAND gate configured to receive the detection signal and the input signal.

4. The signal delay circuit according to claim 1, wherein the signal delay unit comprises:
   a first NAND gate configured to receive an inverted detection signal and the input signal;
   a first buffer configured to delay an output of the first NAND gate;
   a second NAND gate configured to receive the detection signal and the input signal;
   a third NAND gate configured to receive an output of the second NAND gate and an output of the first buffer; and
   a second buffer configured to delay an output of the third NAND gate and output the delayed signal as an output signal.

5. The signal delay circuit according to claim 4, wherein the voltage detection unit generates a high-level detection signal when the external voltage level is lower than the reference voltage.

6. A signal delay circuit comprising:
   a voltage detection unit configured to detect an external voltage level as a plurality of voltage levels, based on a reference voltage, and generate a multi-bit detection signal;
   a decoder configured to decode values of the multi-bit detection signal into a selection signal; and
   a signal delay unit configured to control a delay amount of an input signal in response to the selection signal.

7. The signal delay circuit according to claim 6, wherein the voltage detection unit comprises:
   a reference voltage divider configured to divide the reference voltage level into first and second reference voltages; and
   a comparator configured to compare the external voltage level with the first and second divided reference voltages and generate a 2-bit detection signal, and
   the first divided reference voltage has a higher level than the second divided reference voltage.

8. The signal delay circuit according to claim 7, wherein, when the external voltage level is lower than the first divided reference voltage, the comparator outputs an upper-bit detection signal having a value of 1 and when the external voltage level is lower than the second divided reference voltage, the comparator outputs a lower-bit detection signal having a value of 1.

9. The signal delay circuit according to claim 6, wherein the selection signal comprises first to third selection signals,
the decoder selects and outputs the first selection signal when the multi-bit detection signal in which the external voltage level is detected as a first level or more is inputted, selects and outputs the third selection signal when the multi-bit detection signal in which the external voltage level is detected as a second level or less is inputted, and selects and outputs the second selection signal when the multi-bit detection signal in which the external voltage level corresponds to the other voltage levels is inputted, and
the first level is higher than the second level.

10. The signal delay circuit according to claim 9, wherein the signal delay unit comprises:
a first NAND gate configured to receive the first selection signal and the input signal;
a second NAND gate configured to receive the second selection signal and the input signal;
a third NAND gate configured to receive the third selection signal and the input signal;
a first buffer configured to delay an output of the first NAND gate;
a fourth NAND gate configured to receive an output of the second NAND gate and an output of the first buffer;
a second buffer configured to delay an output of the fourth NAND gate;
a fifth NAND gate configured to receive an output of the third NAND gate and an output of the second buffer; and
a third buffer configured to delay an output of the fifth NAND gate and output the delayed signal as an output signal.

11. The signal delay circuit according to claim 9, wherein the selection signal comprises first to third selection signals, and
the decoder selects and outputs the first selection signal when the multi-bit detection signal is [00], selects and outputs the second selection signal when the multi-bit detection signal is [10], and selects and outputs the third selection signal when the multi-bit detection signal is [11].

12. The signal delay circuit according to claim 11, wherein the signal delay unit comprises:
a first delay selector configured to be enabled to select a delay amount having a first delay time in response to the first selection signal;
a second delay selector configured to be enabled to select a delay amount having a second delay time in response to the second selection signal; and
a third delay selector configured to be enabled to select a delay amount having a third delay time in response to the third selection signal, and
the first delay time is set to be larger than the second delay time, and the second delay time is set to be larger than the third delay time.

13. The signal delay circuit according to claim 12, wherein the first delay selector comprises a first NAND gate configured to receive the first selection signal and the input signal.

14. The signal delay circuit according to claim 12, wherein the second delay selector comprises a second NAND gate configured to receive the second selection signal and the input signal.

15. The signal delay circuit according to claim 12, wherein the third delay selector comprises a third NAND gate configured to receive the third selection signal and the input signal.

* * * * *